United States Patent
Singh et al.

(10) Patent No.: US 10,312,902 B2
(45) Date of Patent: Jun. 4, 2019

(54) LOW-AREA, LOW-POWER, POWER-ON RESET CIRCUIT

(71) Applicant: Analog Devices Global, Hamilton (BM)

(72) Inventors: Amit Kumar Singh, Bangalore (IN); Sriram Ganesan, Bangalore (IN)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/337,587

(22) Filed: Oct. 28, 2016

(65) Prior Publication Data

US 2018/0123583 A1  May 3, 2018

(51) Int. Cl.
*H03K 3/02* (2006.01)
*H03K 17/22* (2006.01)

(52) U.S. Cl.
CPC ... *H03K 17/223* (2013.01); *H03K 2217/0036* (2013.01)

(58) Field of Classification Search
None
See application file for complete search history.

(56) References Cited

U.S. PATENT DOCUMENTS

| | | | | |
|---|---|---|---|---|
| 5,039,873 A | * | 8/1991 | Sasaki | H01P 1/15 327/237 |
| 5,378,932 A | * | 1/1995 | Shin | H03K 3/356017 326/115 |
| 9,632,521 B2 | * | 4/2017 | Iriarte | G05F 3/242 |
| 2014/0266140 A1 | * | 9/2014 | Iriarte | G05F 3/242 323/313 |
| 2014/0266314 A1 | * | 9/2014 | Iriarte | H03K 5/2472 327/81 |
| 2014/0312875 A1 | | 10/2014 | Nascimento | |
| 2016/0105169 A1 | | 4/2016 | Lou | |

* cited by examiner

*Primary Examiner* — Long Nguyen
(74) *Attorney, Agent, or Firm* — Schwegman Lundberg & Woessner, P.A.

(57) ABSTRACT

This application discusses techniques for providing a power-on reset (POR) circuit. The techniques take advantage of the small size of active devices, consume very little current and can use a native NMOS transistor to provide a stable reference over temperature and voltage variations.

20 Claims, 3 Drawing Sheets

LOW-AREA, LOW-POWER, POWER-ON RESET CIRCUIT

TECHNICAL FIELD OF THE DISCLOSURE

Methods and apparatus a power-on-reset (POR) circuit are provided and, more particularly, for a POR circuit that is low-power, robust to even very slow ramp rates, and space efficient.

BACKGROUND

Power-on-reset (POR) circuits typically provide a control signal that keeps processing circuits idle as a power supply powers up and then changes a state of the control signal when the power supply output reaches a minimum voltage. POR circuits are used to assure that upon initial start-up of a device, processing circuits of the device responsive to the control signal begin their respective function in known states. Without a POR circuit, it can be possible for some processing circuitry to begin processing at different times than other processing circuitry because some processing circuitry can become active at a lower supply voltage than other processing circuitry. Such a situation can allow some circuitry to begin processing signals from other circuitry, however, the signals may not be valid. Add in a supply glitch on power up, for example from some processing circuitry starting before other circuitry, and the initial state of a device can become unpredictable. However, adding a POR circuit also adds power consumption and circuit space that can limit other resources or characteristics of a device.

SUMMARY OF THE DISCLOSURE

This application discusses techniques for providing a power-on reset (POR) circuit. In certain examples, the techniques are based on using only active devices and hence consume less area compared to conventional techniques that rely on resistors, capacitors or memory circuits, for example. In addition, the active devices typically consume very little current and can use a native transistor to provide a stable reference over temperature and voltage variations. In certain examples, the techniques do not use a memory circuit and, therefore, can provide robust performance even at very slow supply ramp rate.

In an example, a circuit for providing a power-on reset signal can include a first native transistor configured to generate a reference current indicative of a voltage threshold, and a comparator transistor having a control node coupled to the native NMOS transistor, the comparator transistor configured to compare a sense current with the reference current, wherein the sense current is indicative of a level of a supply voltage of the circuit. A first node of the comparator transistor can be configured to maintain a first state when the reference current is greater than the sense current. The first node of the comparator transistor can be configured to maintain a second state when the sense current is greater than the reference current.

This summary is intended to provide an overview of subject matter of the present patent application. It is not intended to provide an exclusive or exhaustive explanation of the invention. The detailed description is included to provide further information about the present subject matter.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized a technique for providing power-on reset (POR) circuit that is power efficient and uses very little circuit real estate. In certain examples, a POR circuit can take advantage of the small size and efficiency of active devices such that it occupies nor more than 0.01 mm$^2$ consumes 42 nano-amperes (nA) or less of current on average. Maximum current can be about 70 nA. Such a circuit can provide area and power improvements for many circuit applications including low-power applications that relay on limited power sources such as, but not limited to, nodes associated with internet of things (IoT) devices for example.

Figure 1:
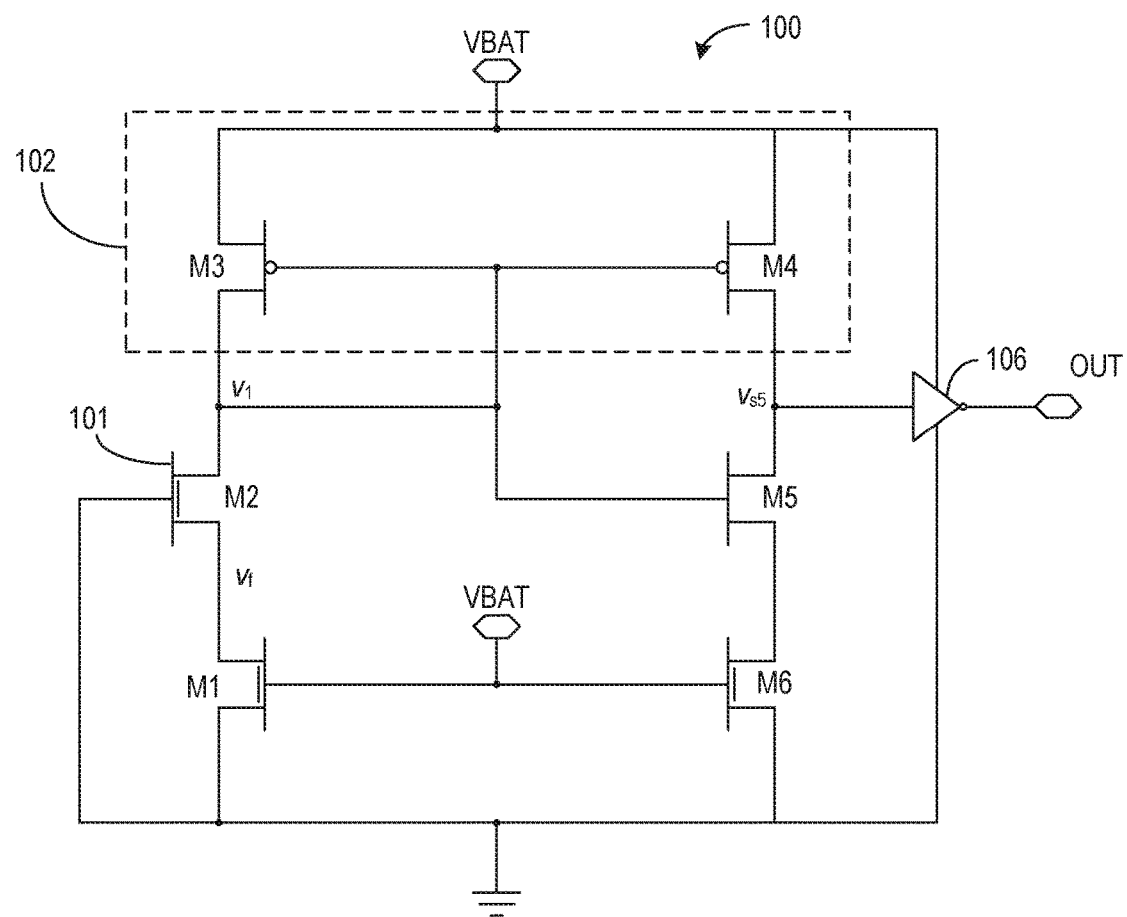
FIG. 1 illustrates generally an example power-on reset (POR) circuit according to various examples of the present subject matter.

FIG. 1 illustrates generally an example power-on reset (POR) circuit 100 according to various examples of the present subject matter. In certain examples, the circuit generates a reference current that is relatively independent of supply voltage (VBAT) and compares that reference current with a current that varies strongly with supply voltage. As the current that varies strongly with the supply voltage, a sense current, exceeds the reference current, the trip point of the POR circuit 100 is crossed and an output of the POR circuit 100 can change states.

In certain examples, other than the traces that connect the circuit elements, the POR circuit 100 does not include any passive devices, such as resistors or capacitors. In certain examples, the POR circuit 100 is implemented with metal-oxide semiconductor (MOS) devices, thus it is very space efficient. For example, in certain examples, the circuit can occupy an area of less than 0.01 mm$^2$ or consume less than 42 nano-amperes (nA) on average. Also, the circuit 100 does not use special active devices that can require extra processing or are not available by default in the process library. Referring again to FIG. 1, the POR circuit 100 can include a reference current generator 101, a current mirror 102 and a comparator transistor (M5). In certain examples, the reference current generator 101 can includes a first native NMOS transistor (M2) having a control node coupled to ground. In such a configuration, the first native NMOS transistor (M2) can generate a reference current that has a very weak function of the supply voltage (VBAT), or is relatively independent of supply voltage (VBAT). In certain examples, additional native NMOS transistors (M1, M6) can be included in the reference current generator to regulate or compensate process and temperature variations of the first, native NMOS transistor (M2) and the comparator transistor (M5). In addition, the additional native NMOS transistors (M1, M6) can allow for tuning the threshold voltage via the reference current. For example, the first native NMOS device (M2) can be added in a source degeneration fashion.

The reference current ($I_{M2}$) provided via the first native NMOS device can be described as, $$I_{M2} = I_{s2} e^{\frac{-vf - vth_{M2}}{n_2 Vt}},$$

where $I_s$ is the scale current of the transistor, vth is the threshold voltage of the transistor, n is the slope factor of the transistor, vf is the voltage at the source node of M2 and Vt is the thermal voltage associated with the first native NMOS transistor (M2). The resistance of a second native NMOS transistor (M1) coupled in series with the first native NMOS transistor can be expressed as, $$R_f \Delta \frac{vf}{I_{M2}} = \left( u_n C_{ox} \frac{W1}{L1} (vBAT - vth_{M1}) \right)^{-1}.$$

Thus, the regulating effect of the second native NMOS transistor (M1) can allow the reference current ($I_{M2}$) to have a weak function of the supply voltage (vBAT). As the supply voltage (vBAT) ramps up from near zero volts, the current mirror 102 can begin to mirror the reference current ($I_{M2}$) as the supply voltage (VBAT) becomes greater than the threshold voltage of the current mirror transistors (M3, M4).

In certain examples, the comparator transistor (M5) can be a standard NMOS device. As the supply voltage (vBAT) increases further, the voltage (v1) at the control node of the comparator transistor (M5) can also follows the supply voltage (vBAT) via the sense transistor (M3) of the current mirror. As the voltage (v1) at the control node of the comparator transistor (M5) continues to rise further, the comparator transistor can be turned ON. Note that since the current of the mirror transistor (M4) is built up but not the current of the comparator transistor (M5), the drain voltage of the comparator transistor (M5) is high, causing the comparator transistor (M5) to be in a saturation region. Current supplied via the comparator transistor (M5) can be expressed as, $$I_{M5} = I_{s5} e^{\frac{v1 - vs5 - vth_{M5}}{n_5 Vt}},$$

Where "vs5" is the voltage at the source of the comparator transistor (M5). Note that the sense current ($I_{M5}$) supplied by the comparator transistor (M5) has a strong function of the supply voltage via the source voltage (v1) of the sense transistor that, as discussed above, can track the supply voltage (vBAT). Also note that when the sense current ($I_{M5}$) provided via the comparator transistor (M5) becomes greater than the mirrored reference current, the drain for the comparator transistor (M5), or the output of the POR circuit, can be pulled lower and eventually change from a logical high state to a logical low state indicating the supply voltage (VBAT) has reached a minimum level. In certain examples, the POR circuit can optionally include a buffer or an inverter 106 to provide a buffered output or to provide a buffered output and an active-high output logic level (OUT) when the supply voltage (vBAT) has exceeded a minimum threshold level established by the reference current ($I_{M2}$).

Figure 2:
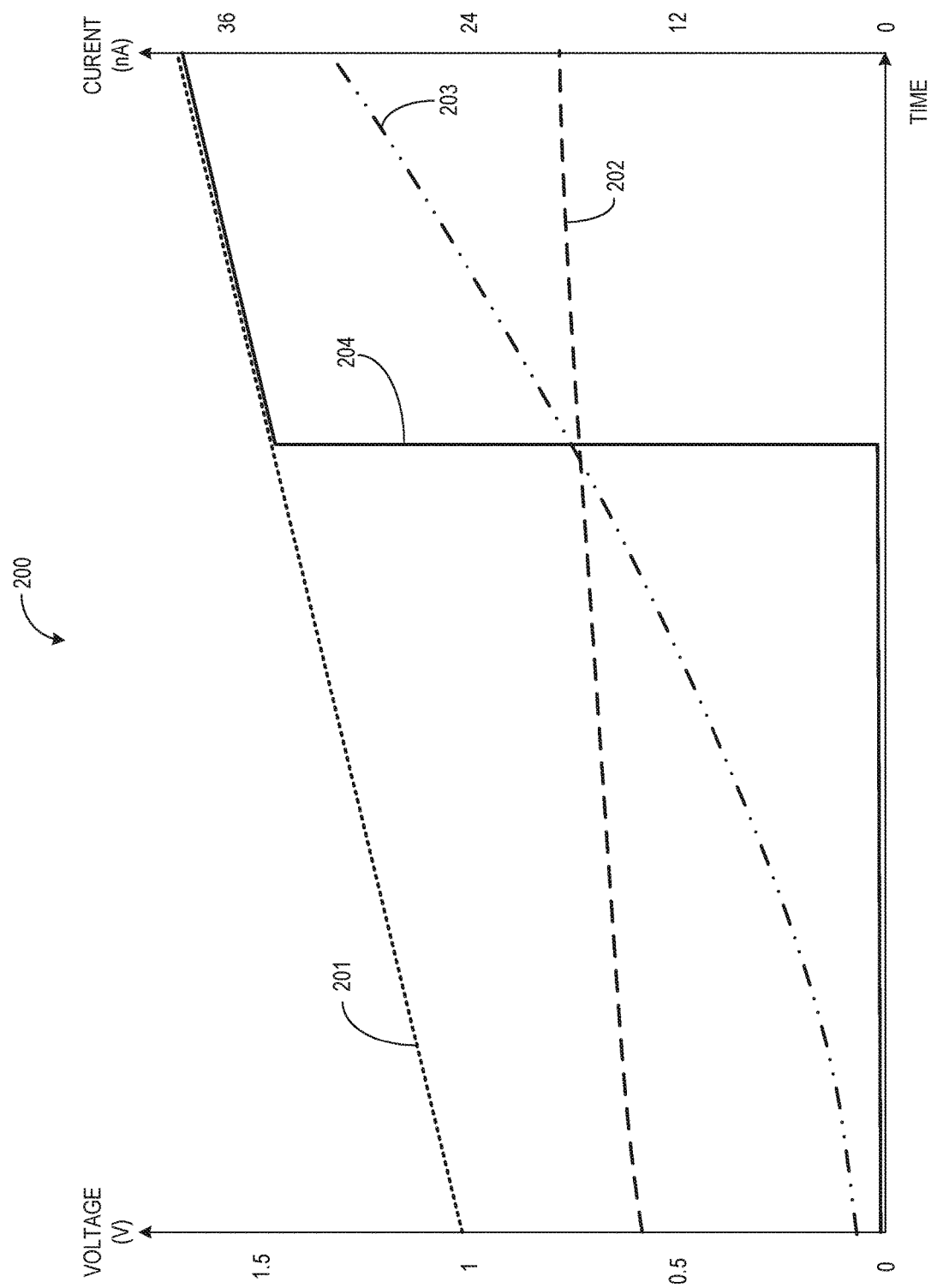
FIG. 2 illustrates graphically the operation of a POR circuit according to various examples of the present subject matter via plots of voltage and current signals associated with the POR circuit.

FIG. 2 illustrates graphically the operation of a POR circuit according to various examples of the present subject matter via plots of voltage and current signals associated with the POR circuit. The graph 200 includes a first plot 201 of a supply voltage, for example, the supply voltage to a device that includes a power-on-reset (POR) circuit according to various examples of the present subject matter, a second plot 202 of the reference current discussed above with respect to FIG. 1, a third plot 203 of the sense current associated with the comparator transistor, and a fourth plot 204 of a buffered and inverted output signal of the POR circuit. The plot of the supply voltage shows the supply voltage as it might appear over time upon first powering up a device. The reference current 202 varies weakly with the rising supply voltage 201 in contrast with the strong variation of the sense current 203. In an example, the reference current 202 can be maintained over temperature such that the associated trip voltage of the POR circuit does not vary more than 330 millivolts (my) over a temperature range of −40° C. to 125° C. As the sense current 203 becomes greater than the reference current 202, the drain node of the comparator transistor can be pulled lower. An inverter coupled to the drain node of the comparator transistor can provide an output signal of the POR circuit that transitions from a low logic state, indicative of a low supply voltage, to a high logic state, indicative of supply voltage level supportive of operation of each processing device component. In certain examples, as the supply voltage drops, the output of the POR circuit can provide an indication that supply voltage has dropped to level where some components may not provide robust operation. In certain examples, the transition point of the output of the POR circuit can be substantially the same whether the supply voltage is rising or falling.

In some examples, selection of the transition points of the POR circuit can be different and selection of, for example, the composition of the additional transistors (FIG. 1; M1, M6) can determine each transition point. For example, the plots illustrated in FIG. 2 used a circuit where the transistors had the following composition where W and L are the dimensions of the gate:

M1: Stack of 20 transistors each having W=0.5µ, L=70µ
M2: W=32µ, L=4.8µ
M3, M4: W=2µ, L=20µ
M5: W=3µ, L=40µ
M6: Stack of 12 transistors each having W=0.5µ, L=70µ

Figure 3:
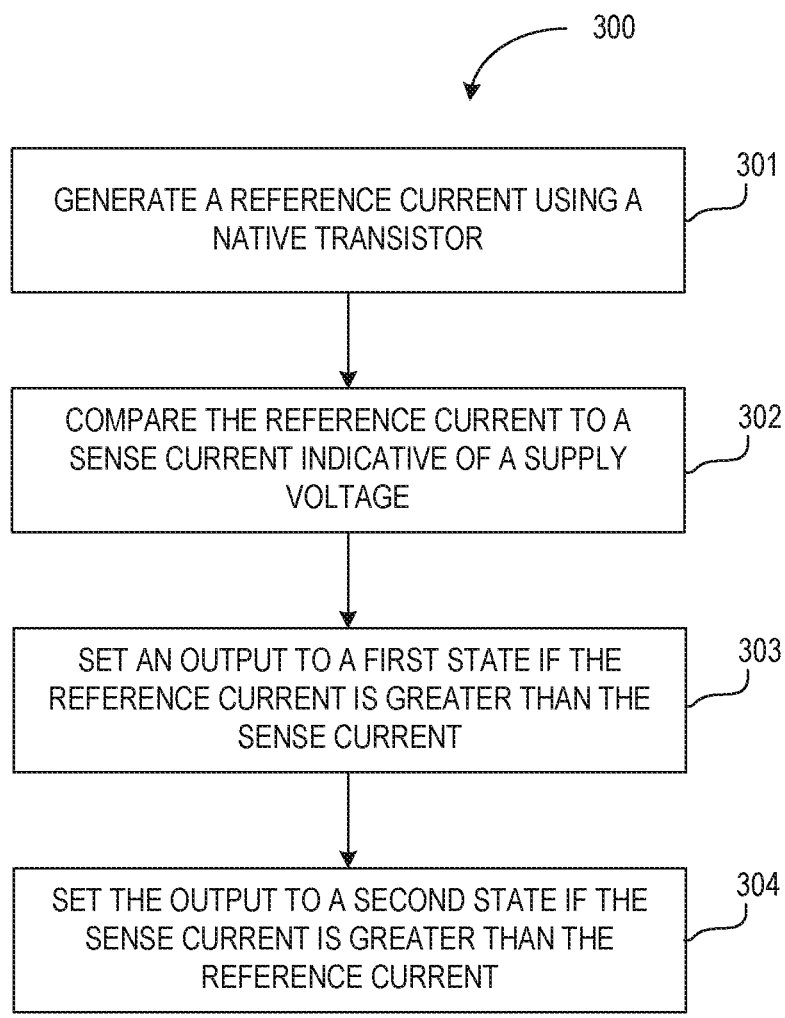
FIG. 3 illustrates generally a flowchart of an example method for operating a power-on-reset (POR) circuit according to various examples of the present subject matter.

FIG. 3 illustrates generally a flowchart of an example method for operating a power-on-reset (POR) circuit according to various examples of the present subject matter. At 301, a reference current can be generated using a native NMOS transistor. In certain examples, the native NMOS transistor can be coupled between a supply voltage and ground and can have a control node coupled to ground. In such a configuration, the reference current passed by the native NMOS transistor is relatively constant with respect to the voltage across the native NMOS transistor. At 302, the reference current can be compared to a sense current. The sense current can be indicative of a voltage level of the supply voltage. In certain examples, a comparator transistor can receive a mirrored version of the reference current and can generate the sense current. In generating the sense current, a node of the comparator transistor can provide an indication of the relative levels of the reference current and the sense current. Because the sense current depends heavily on the level of the supply voltage, the state of the node of the comparator transistor provides an indication of the relative levels of the supply voltage with respect to a threshold represented by the reference current. At 303, the node of the comparator transistor can be set at a first state when the reference current is greater than the sense current. At 304, the node of the comparator transistor can be set at a second state when the sense current is greater than the reference current. In certain examples, the node of the comparator transistor can be an output of the POR circuit. In some examples, an inverter can be used to buffer the node and to provide inverted output states that, in certain situations, can be more useful for providing a POR output signal.

VARIOUS NOTES & EXAMPLES

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A circuit for providing a power-on reset signal, the circuit comprising:
   a first native NMOS transistor configured to generate a reference current indicative of a voltage threshold;
   a comparator transistor having a control node coupled to the first native NMOS transistor, the comparator transistor configured to compare a sense current with the reference current, wherein the sense current is indicative of a level of a supply voltage of the circuit;
   wherein a first node of the comparator transistor is configured to maintain a first state when the reference current is greater than the sense current;
   wherein the first node is configured to maintain a second state when the sense current is greater than the reference current; and
   a second transistor coupled in series with the first native NMOS transistor and a ground reference, the second transistor having a control node coupled to the supply voltage, the second transistor configured to control variations of the reference current set by the first native NMOS transistor.

2. The circuit of claim 1, including a current mirror configured to mirror the reference current to the first node of the comparator transistor.

3. The circuit of claim 2, wherein the current mirror includes a sense transistor and a mirror transistor; and
   wherein the control node of the comparator transistor is coupled to a control node of the sense transistor and to a control node of the mirror transistor.

4. The circuit of claim 1, wherein the second transistor is a a second native NMOS transistor.

5. The circuit of claim 4, including a third native NMOS transistor coupled in series with the comparator transistor and the ground reference, the third native NMOS transistor having a control node coupled to the supply voltage.

6. The circuit of claim 5, wherein the second native NMOS transistor includes a plurality of native NMOS transistors arranged in a stack.

7. The circuit of claim 5, wherein the third native NMOS transistor includes multiple native NMOS transistors arranged in a stack.

8. The circuit of claim 5, wherein the circuit occupies an area of less than 0.01 mm$^2$.

9. The circuit of claim 5, wherein the circuit is configured to use 42 nano-amperes (nA) or less on average.

10. The circuit of claim 5, wherein the threshold voltage associated with the reference current is configured to vary less than 330 millivolts (mV) over a temperature range of −40° C. to 125° C.

11. A power-on reset circuit comprising:
    a first native NMOS transistor configured to generate a reference current
    a current mirror configured to mirror the reference current,
    a comparator transistor configured to receive and compare the reference current with a sense current indicative of a supply voltage; and
    second and third native NMOS transistors;
    wherein a sense transistor of the current mirror is coupled to ground via the first native NMOS transistor and the second native NMOS transistor;
    wherein a mirror transistor of the current mirror is coupled to ground via the comparator transistor and the third native NMOS transistor;
    wherein a control node of the comparator transistor is coupled to a control node of the sense transistor and to a control node of the mirror transistor; and wherein a node coupling the mirror transistor to the comparator transistor provides an output of the power-on reset circuit.

12. The power-on reset circuit of claim 11, the power-on reset circuit occupies an area of less than 0.01 mm².

13. The power-on reset circuit of claim 11, including a buffer coupled to a drain of the comparator transistor and configured to provide a second output of the power-on reset circuit.

14. The power-on reset circuit of claim 13, wherein the buffer includes an inverter.

15. A method for providing a power-on reset signal, the method comprising:
   generating a reference current indicative of a voltage threshold using a first native NMOS transistor, wherein the generating the reference current includes setting a level of the reference current using a second transistor coupled between a second node of the first native NMOS transistor and the ground, wherein a control node of the second transistor is coupled to the supply voltage;
   comparing the reference current to the sense current, the sense current indicative of a level of the supply voltage of a circuit responsive to the power-on reset signal;
   setting an output of a comparison circuit to a first state if the reference current is greater than the sense current;
   setting the output of the comparison circuit to a second state if the sense current is greater than the reference current.

16. The method of claim 15, wherein the generating the reference current includes coupling a control node of the first native NMOS transistor to a ground.

17. The method of claim 15, wherein the comparing the reference current to a sense current includes:
   mirroring the reference current to a first node of a comparator transistor using a mirror transistor of a current mirror, the mirror transistor coupled between the comparator transistor and the supply voltage;
   generating a control voltage from a node common to a sense transistor of the current mirror and to the first native NMOS transistor;
   receiving the control voltage at a control node of the comparator transistor.

18. The method of claim 17, wherein the comparing the reference current to a sense current includes generating the sense current at the comparator transistor using the control voltage.

19. The method of claim 15, wherein the second transistor is a second native NMOS transistor.

20. The method of claim 19, wherein the second native NMOS transistor includes a plurality of native NMOS transistor coupled in a stack configuration.

* * * * *